(12) United States Patent
Ferraris

(10) Patent No.: US 9,077,880 B2
(45) Date of Patent: Jul. 7, 2015

(54) IMAGE CAPTURING MODULE AND IMAGE SENSING UNIT THEREOF

(71) Applicant: LITE-ON TECHNOLOGY CORPORATION, Taipei (TW)

(72) Inventor: Charles Ian Daduya Ferraris, Taoyuan County (TW)

(73) Assignee: LITE-ON TECHNOLOGY CORPORATION, Taipei (TW)

( * ) Notice: Subject to any disclaimer, the term of this patent is extended or adjusted under 35 U.S.C. 154(b) by 17 days.

(21) Appl. No.: 14/028,671

(22) Filed: Sep. 17, 2013

(65) Prior Publication Data

US 2015/0077625 A1 Mar. 19, 2015

(51) Int. Cl.
*H04N 5/225* (2006.01)
*H01L 27/146* (2006.01)

(52) U.S. Cl.
CPC ........... *H04N 5/2254* (2013.01); *H04N 5/2253* (2013.01); *H01L 27/14627* (2013.01)

(58) Field of Classification Search
CPC ............... H04N 5/2253; H04N 5/2254; H01L 27/14627
USPC ............ 348/340, 373, 374, 294, 345; 438/64, 438/65, 66
See application file for complete search history.

(56) References Cited

U.S. PATENT DOCUMENTS

| | | | | |
|---|---|---|---|---|
| 2009/0014824 A1* | 1/2009 | Sakoh et al. | ..................... | 438/72 |
| 2012/0062771 A1* | 3/2012 | Ueno et al. | ..................... | 348/294 |
| 2013/0070148 A1* | 3/2013 | Kim | .............................. | 348/357 |
| 2013/0270419 A1* | 10/2013 | Singh et al. | ..................... | 438/65 |
| 2014/0118516 A1* | 5/2014 | Suzuki et al. | ................. | 348/374 |

* cited by examiner

*Primary Examiner* — Nhan T Tran
(74) *Attorney, Agent, or Firm* — Li & Cai Intellectual Property (USA) Office

(57) ABSTRACT

An image capturing module includes an image sensing unit and an optical auxiliary unit. The image sensing unit includes a carrier substrate, an image sensing chip disposed on the carrier substrate and electrically connected to the carrier substrate, a microlens array substrate disposed on the image sensing chip, and a nonconductive photosensitive film layer disposed on the microlens array substrate for increasing the light absorption capability. The optical auxiliary unit includes a housing frame and a movable lens assembly. The housing frame is disposed on the carrier substrate to cover the image sensing chip, the microlens array substrate and the nonconductive photosensitive film layer, and the movable lens assembly is movably disposed in the housing frame.

13 Claims, 4 Drawing Sheets

IMAGE CAPTURING MODULE AND IMAGE SENSING UNIT THEREOF

BACKGROUND OF THE INVENTION

1. Field of the Invention

The instant disclosure relates to an image capturing module and an image sensing unit thereof, and more particularly to an image capturing module and an image sensing unit thereof for increasing the image quality.

2. Description of Related Art

Recently, it becomes more and more popular for portable devices such as mobile phones or PDA to be equipped with an imaging module. Furthermore, since the market requires these portable devices to have more powerful functions and smaller sizes, it is necessary for the imaging module to generate high quality pictures and to be of small size accordingly. One improvement of picture quality is to increase the number of pixel. The pixel number of an imaging module has already increased from the VGA-level 30 pixels to 2, 5, 8, 13 or even 41 million pixels, which is now common in the market. Another improvement lies in the definition of the image. Thus, the imaging module of a portable device also develops from a fixed-focus mode to auto-focus mode or even optical zoom mode.

The auto-focus mode employs the principle of moving the lens in the imaging module suitably according to various distances of targets, whereby the optical image of the desired target can be focused correctly on an image sensor so as to generate a clear image. The common ways of activating the lens to move in the imaging module include activating by a stepping motor, piezoelectric motor and voice coil motor (VCM). However, when light source is not enough, the image quality provided by the imaging module would be decreased.

SUMMARY OF THE INVENTION

One aspect of the instant disclosure relates to an image capturing module and an image sensing unit of the image capturing module for increasing the image quality.

One of the embodiments of the instant disclosure provides an image capturing module, comprising: an image sensing unit and an optical auxiliary unit. The image sensing unit includes a carrier substrate, an image sensing chip disposed on the carrier substrate and electrically connected to the carrier substrate, a microlens array substrate disposed on the image sensing chip, and a nonconductive photosensitive film layer disposed on the microlens array substrate for increasing the light absorption capability. The optical auxiliary unit includes a housing frame and a movable lens assembly, wherein the housing frame is disposed on the carrier substrate to cover the image sensing chip, the microlens array substrate and the nonconductive photosensitive film layer, and the movable lens assembly is movably disposed in the housing frame.

Another one of the embodiments of the instant disclosure provides an image capturing module, comprising: an image sensing unit and an optical auxiliary unit. The image sensing unit includes a carrier substrate, an image sensing chip disposed on the carrier substrate and electrically connected to the carrier substrate, a microlens array substrate disposed on the image sensing chip, a nonconductive photosensitive film layer disposed on the microlens array substrate for increasing the light absorption capability, a plurality of conductive lines disposed on the microlens array substrate, and at least one electronic component disposed on the microlens array substrate and electrically connected to the conductive lines. The optical auxiliary unit includes a housing frame and a movable lens assembly, wherein the housing frame is disposed on the carrier substrate to cover the image sensing chip, the microlens array substrate and the nonconductive photosensitive film layer, and the movable lens assembly is movably disposed in the housing frame.

Yet another one of the embodiments of the instant disclosure provides an image sensing unit, comprising: a carrier substrate, an image sensing chip disposed on the carrier substrate and electrically connected to the carrier substrate, a microlens array substrate disposed on the image sensing chip, and a nonconductive photosensitive film layer disposed on the microlens array substrate for increasing the light absorption capability.

Therefore, because "the microlens array substrate disposed on the image sensing chip" and "the nonconductive photosensitive film layer disposed on the microlens array substrate for increasing the light absorption capability" are used in the same image capturing module, the image quality of the instant disclosure can be increased.

To further understand the techniques, means and effects of the instant disclosure applied for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention to limit the instant disclosure.

DETAILED DESCRIPTION OF THE PREFERRED EMBODIMENTS

First Embodiment

Figure 1:
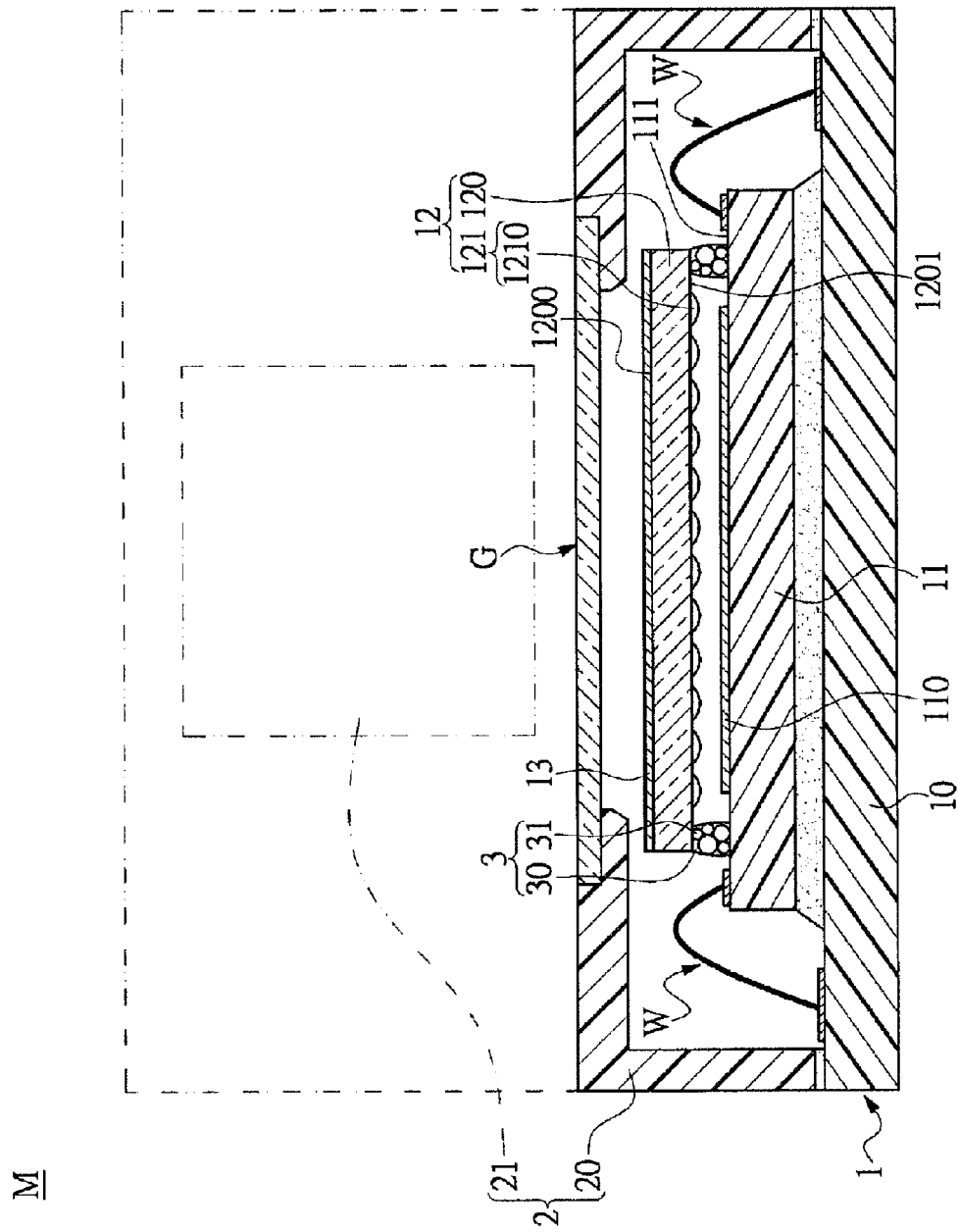
FIG. 1 shows a lateral, cross-sectional, schematic view of the image capturing module according to the first embodiment of the instant disclosure.
Figure 2:
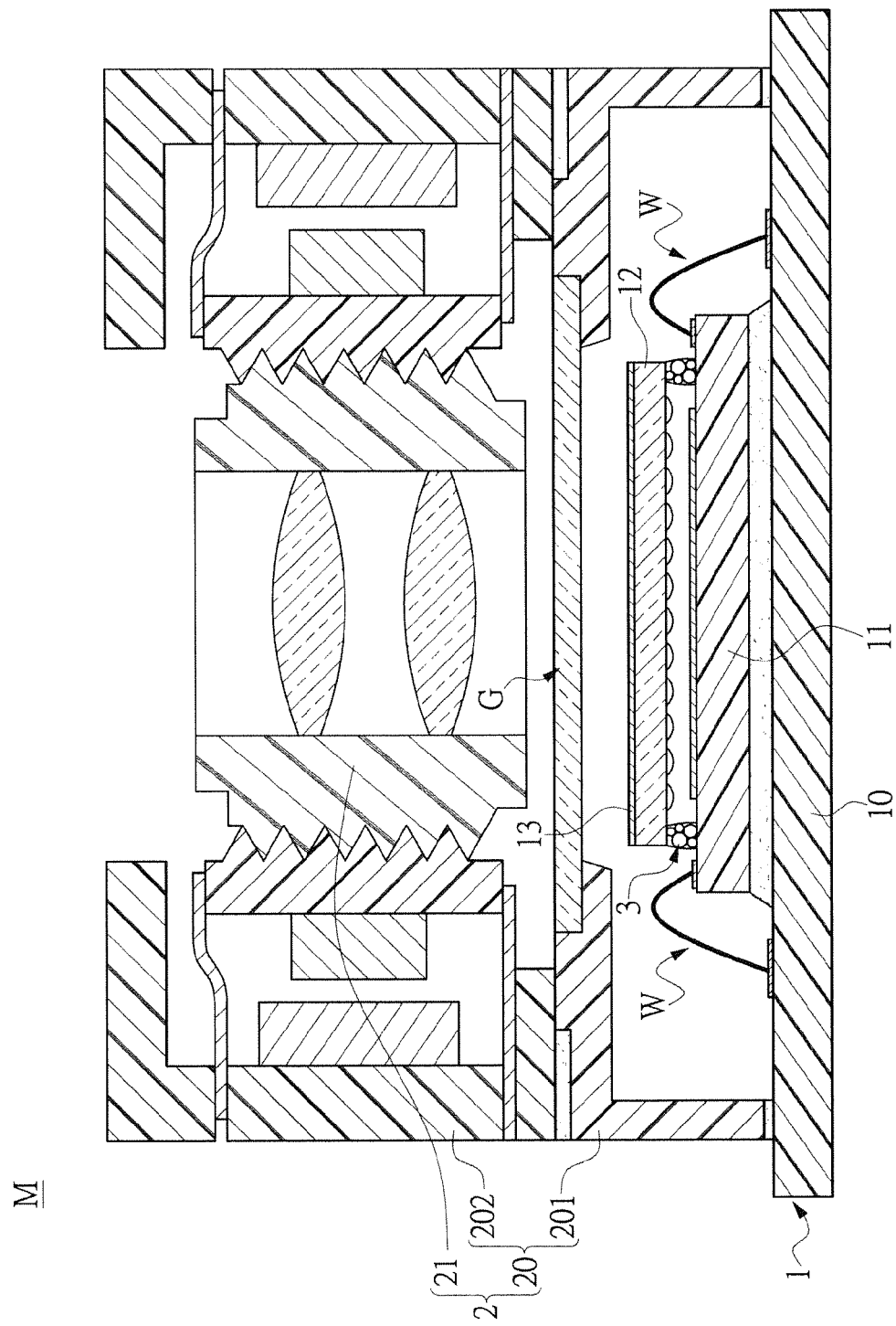
FIG. 2 shows a lateral, cross-sectional, schematic view of the image capturing module using a voice coil actuator according to the first embodiment of the instant disclosure.

Referring to FIG. 1 and FIG. 2, where the first embodiment of the instant disclosure provides an image capturing module M, comprising: an image sensing unit 1 and an optical auxiliary unit 2.

First, the image sensing unit 1 includes a carrier substrate 10, an image sensing chip 11 disposed on the carrier substrate 10 and electrically connected to the carrier substrate 10, a microlens array substrate 12 disposed on the image sensing chip 11, and a nonconductive photosensitive film layer 13 disposed on the microlens array substrate 12 for increasing the light absorption capability. For example, the image sensing chip 11 can be adhesively disposed on the carrier substrate 10 through any type of adhesive material (not labeled) such as UV adhesive glue, thermosetting glue or oven curing glue etc. In addition, the carrier substrate 10 may be a circuit substrate having a plurality of conductive pads (not labeled) disposed on the top surface of the circuit substrate, and the image sensing chip 11 has a plurality of conductive pads (not labeled) disposed on the top surface of the image sensing chip 11. Each conductive pad of the image sensing chip 11 can be electrically connected to the corresponding conducive pad of the carrier substrate 10 through the corresponding conducive wire W, thus the image sensing chip 11 can be electrically connected with the carrier substrate 10 through the conductive wires W. Furthermore, the nonconductive photosensitive film layer 13 may be made of any type of nano-material for increasing the light absorption capability, and the nonconductive photosensitive film layer 13 can be disposed on the microlens array substrate 12 by laminating, coating, spraying or sputtering etc. Whereby, the image quality (such as the sharpness and the resolution) provided by the image sensing unit 1 can be increased by matching the microlens array substrate 12 and the nonconductive photosensitive film layer 13.

Moreover, the microlens array substrate 12 includes a light-transmitting substrate 120 and a microlens array 121 disposed on the bottom surface 1201 of the light-transmitting substrate 120. The microlens array 121 may be composed of a plurality of micro lenses 1210 separated from each other by a predetermined distance, and the nonconductive photosensitive film layer 13 is disposed on the top surface 1200 of the light-transmitting substrate 120. The nonconductive photosensitive film layer 13 can be used to efficiently guide light source to the micro lenses 1210 of the microlens array 121 of the microlens array substrate 12, thus the image quality provided by the image sensing unit 1 can be increased by matching the microlens array substrate 12 and the nonconductive photosensitive film layer 13. In addition, the light-transmitting substrate 120 of the microlens array substrate 12 can be adhesively disposed on the image sensing chip 11 through a plurality of adhesive units 3 (or only a surrounding adhesive unit 3), and each adhesive unit 3 can be formed by mixing adhesive glue 30 (such as epoxy or silicone) and a plurality of micro spacers 31 inside the adhesive glue 30. The height of the microlens array substrate 12 relative to the image sensing chip 11 can be adjusted by the micro spacers 31. For example, each micro spacer 31 may be a microsphere made of glass, PE (polyethylene), silica, or polymer etc.

More precisely, the image sensing chip 11 has an image sensing area 110 and a non-image sensing area 111 disposed on the top side thereof and around the image sensing area 110. The adhesive units 3 are disposed between the bottom surface 1201 of the light-transmitting substrate 120 and the non-image sensing area 111 of the image sensing chip 11, the microlens array substrate 12 can be separated from the image sensing area 110 of the image sensing chip 11 by a predetermined distance through the adhesive units 3 (i.e., the microlens array substrate 12 is supported above the image sensing area 110 of the image sensing chip 11 by the adhesive units 3), and the microlens array 121 of the microlens array substrate 12 correspondingly faces the image sensing area 110 of the image sensing chip 11. It's worth mentioning that the light-transmitting substrate 120 of the microlens array substrate 12 and the surrounding adhesive unit 3 can be matched with each other to form a cover assembly to completely protect the image sensing area 110 of the image sensing chip 11, thus the cleanliness of the image sensing area 110 of the image sensing chip 11 can be increased.

Furthermore, the optical auxiliary unit 2 includes a housing frame 20 and a movable lens assembly 21, wherein the housing frame 20 is disposed on the carrier substrate 10 to cover the image sensing chip 11, the microlens array substrate 12 and the nonconductive photosensitive film layer 13, and the movable lens assembly 21 is movably disposed in the housing frame 20. For example, the optical auxiliary unit 2 may be a voice coil actuator, but the voice coil actuator used in the first embodiment is merely an example and is not meant to limit the instant disclosure. The housing frame 20 can be adhesively disposed on the carrier substrate 10 through the adhesive glue, and the movable lens assembly 21 may be composed of a plurality of optical lens (not labeled). In addition, the housing frame 20 includes a first holder 201 disposed on the carrier substrate 10 and a second holder 202 disposed on the first holder 201, the image sensing chip 11 is disposed on the first holder 201 of the housing frame 20, and the movable lens assembly 21 is movably disposed in the second holder 202 of the housing frame 20. However, the optical auxiliary unit 2 used in the first embodiment is merely an example and is not meant to limit the instant disclosure. For example, the optical auxiliary unit 2 can be composed of a fixed plastic holder and a fixed lens assembly fixedly disposed in the fixed plastic holder through fastening glue.

It's worth mentioning that the image capturing module M further includes a cover glass G supported by the housing frame 20 and disposed between the image sensing unit 1 and the movable lens assembly 21, for enhancing the image performance and the sensor surface cleanliness of the image sensing unit 1. For example, the cover glass G may be a borosilicate glass (a white/clear glass), a IR coated glass, a LSS glass, or a blue glass etc., but it is merely an example and not meant to limit the instant disclosure.

Second Embodiment

Figure 3:
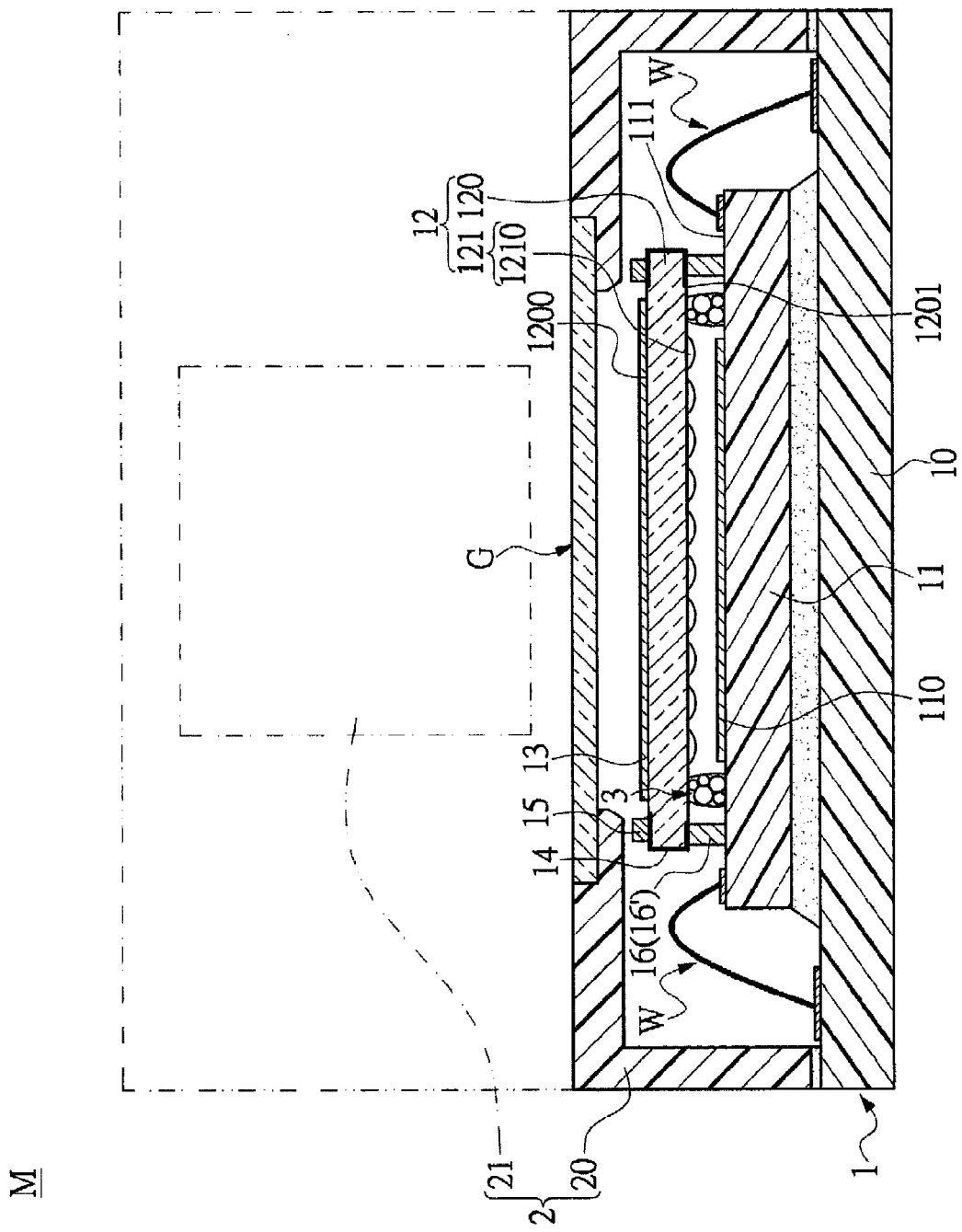
FIG. 3 shows a lateral, cross-sectional, schematic view of the image capturing module according to the second embodiment of the instant disclosure.

Referring to FIG. 3, where the second embodiment of the instant disclosure provides an image capturing module M, comprising: an image sensing unit 1 and an optical auxiliary unit 2. Comparing FIG. 3 with FIG. 1, the difference between the second embodiment and the first embodiment is as follows: in the second embodiment, the image sensing unit 1 further includes a plurality of conductive lines 14 disposed on the microlens array substrate 12 and separated from the nonconductive photosensitive film layer 13 and at least one electronic component 15 (such as a semiconducting electronic component) disposed on the microlens array substrate 12 and electrically connected to the conductive lines 14. Hence, the at least one electronic component 15 can be electrically connected to the image sensing chip 11 or the carrier substrate 10 through the corresponding conductive line 14 and one of an anisotropic conductive film (ACF) 16 and an anisotropic conductive adhesive (ACA) 16' in sequence. Whereby, the at least one electronic component 15 can be directly disposed on the light-transmitting substrate 120 of the microlens array substrate 12, thus the spatial reuse of the image capturing module M can be increased, so as to decrease the whole volume of the image capturing module M.

Third Embodiment

Figure 4:
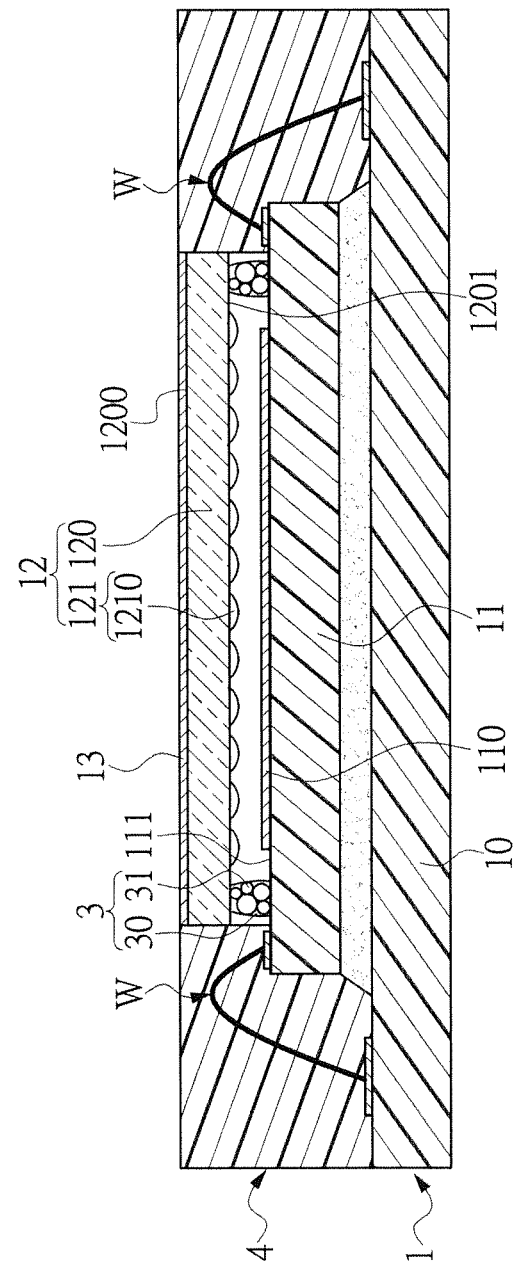
FIG. 4 shows a lateral, cross-sectional, schematic view of the image sensing unit of the image capturing module according to the third embodiment of the instant disclosure.

Referring to FIG. 4, where the third embodiment of the instant disclosure provides an image capturing module M, comprising: an image sensing unit 1 and an optical auxiliary unit (not shown) disposed on the image sensing unit 1. Comparing FIG. 4 with FIG. 1, the difference between the third embodiment and the first embodiment is as follows: in the third embodiment, the image sensing unit 1 further includes a package resin encapsulation 4 disposed on the carrier substrate 10 to cover one part of the image sensing chip 11 and disposed around the image sensing chip 11 and the microlens array substrate 12. In other words, the image sensing unit 1 can be packaged by the package resin encapsulation in advance to form a modular image sensing module. More precisely, the conductive wires W can be completely enclosed by the package resin encapsulation 4, and the package resin encapsulation 4 can directly touch the edge of the glass G, but it is merely an example and not meant to limit the instant disclosure.

In conclusion, because "the microlens array substrate 12 disposed on the image sensing chip 11" and "the nonconductive photosensitive film layer 13 disposed on the microlens array substrate 12 for increasing the light absorption capability" are used in the same image capturing module M, the image quality of the instant disclosure can be increased.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. An image capturing module, comprising:
   an image sensing unit including a carrier substrate, an image sensing chip disposed on the carrier substrate and electrically connected to the carrier substrate, a microlens array substrate disposed on the image sensing chip, and a nonconductive photosensitive film layer disposed on the microlens array substrate for increasing the light absorption capability;
   an optical auxiliary unit including a housing frame and a movable lens assembly, wherein the housing frame is disposed on the carrier substrate to cover the image sensing chip, the microlens array substrate and the nonconductive photosensitive film layer, and the movable lens assembly is movably disposed in the housing frame;
   a plurality of conductive lines disposed on the microlens array substrate; and
   at least one electronic component disposed on the microlens array substrate and electrically connected to the conductive lines;
   wherein the at least one electronic component is electrically connected to the image sensing chip through the corresponding conductive line and one of an anisotropic conductive film and an anisotropic conductive adhesive in sequence.

2. The image capturing module of claim 1, wherein the microlens array substrate includes a light-transmitting substrate and a microlens array disposed on the bottom surface of the light-transmitting substrate, the microlens array is composed of a plurality of micro lenses separated from each other by a predetermined distance, and the nonconductive photosensitive film layer is disposed on the top surface of the light-transmitting substrate.

3. The image capturing module of claim 2, wherein the light-transmitting substrate of the microlens array substrate is adhesively disposed on the image sensing chip through a plurality of adhesive units, and each adhesive unit is formed by mixing adhesive glue and a plurality of micro spacers, wherein the image sensing chip has an image sensing area and a non-image sensing area disposed on the top side thereof, the adhesive units are disposed between the bottom surface of the light-transmitting substrate and the non-image sensing area of the image sensing chip, the microlens array substrate is separated from the image sensing area of the image sensing chip through the adhesive units, and the microlens array of the microlens array substrate correspondingly faces the image sensing area of the image sensing chip.

4. The image capturing module of claim 1, wherein the housing frame includes a first holder disposed on the carrier substrate and a second holder disposed on the first holder, the image sensing chip is disposed on the first holder of the housing frame, and the movable lens assembly is movably disposed in the second holder of the housing frame.

5. An image capturing module, comprising:
   an image sensing unit including a carrier substrate, an image sensing chip disposed on the carrier substrate and electrically connected to the carrier substrate, a microlens array substrate disposed on the image sensing chip, a nonconductive photosensitive film layer disposed on the microlens array substrate for increasing the light absorption capability, a plurality of conductive lines disposed on the microlens array substrate, and at least one electronic component disposed on the microlens array substrate and electrically connected to the conductive lines; and
   an optical auxiliary unit including a housing frame and a movable lens assembly, wherein the housing frame is disposed on the carrier substrate to cover the image sensing chip, the microlens array substrate and the nonconductive photosensitive film layer, and the movable lens assembly is movably disposed in the housing frame.

6. The image capturing module of claim 5, wherein the microlens array substrate includes a light-transmitting substrate and a microlens array disposed on the bottom surface of the light-transmitting substrate, the microlens array is composed of a plurality of micro lenses separated from each other by a predetermined distance, and the nonconductive photosensitive film layer is disposed on the top surface of the light-transmitting substrate.

7. The image capturing module of claim 6, wherein the light-transmitting substrate of the microlens array substrate is adhesively disposed on the image sensing chip through a plurality of adhesive units, and each adhesive unit is formed by mixing adhesive glue and a plurality of micro spacers, wherein the image sensing chip has an image sensing area and a non-image sensing area disposed on the top side thereof, the adhesive units are disposed between the bottom surface of the light-transmitting substrate and the non-image sensing area of the image sensing chip, the microlens array substrate is separated from the image sensing area of the image sensing chip through the adhesive units, and the microlens array of the microlens array substrate correspondingly faces the image sensing area of the image sensing chip.

8. The image capturing module of claim 5, wherein the at least one electronic component is electrically connected to the image sensing chip through the corresponding conductive line and one of an anisotropic conductive film and an anisotropic conductive adhesive in sequence.

9. The image capturing module of claim 5, wherein the housing frame includes a first holder disposed on the carrier substrate and a second holder disposed on the first holder, the image sensing chip is disposed on the first holder of the housing frame, and the movable lens assembly is movably disposed in the second holder of the housing frame.

10. An image sensing unit, comprising:
    a carrier substrate;
    an image sensing chip disposed on the carrier substrate and electrically connected to the carrier substrate;
    a microlens array substrate disposed on the image sensing chip;
    a nonconductive photosensitive film layer disposed on the microlens array substrate for increasing the light absorption capability;

a plurality of conductive lines disposed on the microlens array substrate; and at least one electronic component disposed on the microlens array substrate and electrically connected to the conductive lines;

wherein the at least one electronic component is electrically connected to the image sensing chip through the corresponding conductive line and one of an anisotropic conductive film and an anisotropic conductive adhesive in sequence.

11. The image sensing unit of claim 10, further comprising: a package resin encapsulation disposed on the carrier substrate to cover one part of the image sensing chip and disposed around the image sensing chip and the microlens array substrate.

12. The image sensing unit of claim 10, wherein the microlens array substrate includes a light-transmitting substrate and a microlens array disposed on the bottom surface of the light-transmitting substrate, the microlens array is composed of a plurality of micro lenses separated from each other by a predetermined distance, and the nonconductive photosensitive film layer is disposed on the top surface of the light-transmitting substrate.

13. The image sensing unit of claim 12, wherein the light-transmitting substrate of the microlens array substrate is adhesively disposed on the image sensing chip through a plurality of adhesive units, and each adhesive unit is formed by mixing adhesive glue and a plurality of micro spacers, wherein the image sensing chip has an image sensing area and a non-image sensing area disposed on the top side thereof, the adhesive units are disposed between the bottom surface of the light-transmitting substrate and the non-image sensing area of the image sensing chip, the microlens array substrate is separated from the image sensing area of the image sensing chip through the adhesive units, and the microlens array of the microlens array substrate correspondingly faces the image sensing area of the image sensing chip.

* * * * *